United States Patent
Hamburgen et al.

(10) Patent No.: US 11,474,563 B2
(45) Date of Patent: Oct. 18, 2022

(54) FOLDABLE DISPLAY DEVICES WITH MULTIPLE PAGES

(71) Applicant: GOOGLE LLC, Mountain View, CA (US)

(72) Inventors: William Riis Hamburgen, Palo Alto, CA (US); Ken Foo, Sunnyvale, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 16/625,609

(22) PCT Filed: Dec. 20, 2018

(86) PCT No.: PCT/US2018/066983
§ 371 (c)(1),
(2) Date: Dec. 20, 2019

(87) PCT Pub. No.: WO2019/126601
PCT Pub. Date: Jun. 27, 2019

(65) Prior Publication Data
US 2021/0034110 A1 Feb. 4, 2021

Related U.S. Application Data

(60) Provisional application No. 62/608,382, filed on Dec. 20, 2017.

(51) Int. Cl.
*G06F 3/0483* (2013.01)
*H04N 5/232* (2006.01)
(Continued)

(52) U.S. Cl.
CPC .......... *G06F 1/1652* (2013.01); *G06F 1/1616* (2013.01); *G06F 1/1641* (2013.01);
(Continued)

(58) Field of Classification Search
CPC ..................... G06F 1/1652; G09G 2380/02
See application file for complete search history.

(56) References Cited

U.S. PATENT DOCUMENTS

| 6,577,496 B1 | 6/2003 | Gioscia et al. |
| 2007/0211036 A1* | 9/2007 | Perkins ............. G06F 1/1677 345/173 |

(Continued)

FOREIGN PATENT DOCUMENTS

| EP | 2811365 A1 | 12/2014 |
| KR | 101463387 B1 | 11/2014 |
| WO | 2017113393 A1 | 7/2017 |

OTHER PUBLICATIONS

International Search Report and Written Opinion for International Application No. PCT/US2018/066983, dated May 31, 2019, 20 pages.

(Continued)

*Primary Examiner* — Nan-Ying Yang
(74) *Attorney, Agent, or Firm* — Brake Hughes Bellermann LLP

(57) ABSTRACT

A computing device includes memory configured for storing executable instructions, a processor configured for executing the instructions, a spine member, where the spine member includes the memory and the processor, and a plurality of display pages, each display page coupled at a first edge of the page to the spine member and having a second edge, opposite the first edge that is free to rotate about an axis defined by the spine member, wherein at least one page includes two separately controllable OLED displays on opposite sides of the page.

11 Claims, 17 Drawing Sheets

(51) Int. Cl.
    *G06F 1/16*     (2006.01)
    *H04M 1/02*     (2006.01)
    *G09G 3/00*     (2006.01)
    *H01L 27/32*        (2006.01)
    *H04B 1/3827*       (2015.01)

(52) U.S. Cl.
    CPC ........... *G06F 1/1681* (2013.01); *G09G 3/035* (2020.08); *H04M 1/0268* (2013.01); *H01L 27/3244* (2013.01); *H04B 1/3827* (2013.01); *H04M 1/022* (2013.01); *H04M 2250/16* (2013.01)

(56)            References Cited

U.S. PATENT DOCUMENTS

| 2015/0266272 | A1* | 9/2015  | Lee ......................... B32B 17/10 |
|              |     |         | 428/189                                  |
| 2017/0359914 | A1* | 12/2017 | Yanagisawa ......... H05K 5/0021         |
| 2017/0364220 | A1* | 12/2017 | Karl ....................... H04N 5/232  |
| 2018/0103132 | A1* | 4/2018  | Prushinskiy ........ H04M 1/0268         |
| 2018/0188910 | A1* | 7/2018  | Ko ...................... G06F 3/04886   |

OTHER PUBLICATIONS

Invitation to Pay Additional Fees for International Application No. PCT/US2018/066983, dated Mar. 27, 2019, 13 pages.

\* cited by examiner

FOLDABLE DISPLAY DEVICES WITH MULTIPLE PAGES

CROSS REFERENCE TO RELATED APPLICATIONS

This application is a 35 U.S.C. § 371 National Phase Entry Application from PCT/US2018/066983, filed Dec. 20, 2018, designating the U.S., and claims the benefit of U.S. Provisional Application No. 62/608,382, filed Dec. 20, 2017, the disclosures of which are incorporated herein by reference in their entireties.

TECHNICAL FIELD

This description relates to thin film materials and, in particular, to monolayer fiber-reinforced films.

BACKGROUND

Modern computing devices often attempt to achieve a balance between portability and functionality. A tension can exist between having a display that provides for a rich display of information on a single surface, which suggests a relatively large form factor of the device to accommodate a relatively large display, and a device that is small enough to be easily carried and accessed by a user, which suggests a relatively small form factor of the device.

A potential solution to address this dilemma is to use a foldable flexible display in the computing device, so that in the display's folded configuration, the computing device has a relatively small form factor, and in the display's unfolded configuration, the computing device can have a relatively large display. However, even with a foldable display device, it may be frustrating for a user to use the device in one mode or the other—e.g., the unfolded configuration may seem too large and unwieldly and the folded configuration can seem to small to properly display content—or it may be frustrating for a user to switch between modes.

Moreover, when utilizing a foldable display, to keep the form factor of the computing device small and slim, it is desirable to have a relatively thin display. However, folding a relatively thin display can result in small radius bends at the fold in the display, which may be detrimental to sensitive components of the display, for example, thin film transistors (TFTs), organic light-emitting diodes (OLEDs), thin-film encapsulation (TFE) and the like.

SUMMARY

In a general aspect, a computing device includes memory configured for storing executable instructions, a processor configured for executing the instructions, a first base portion, a second base portion, a hinge mechanism that couples the first base portion to the second base portion, a foldable display, and a bend limit layer. The foldable display has a first portion coupled to the first base portion and a second portion coupled to the second base portion, with the foldable display being configured for displaying information in response to the execution of the instructions. The bend limit layer is coupled to the foldable display and arranged substantially parallel to a display surface of the foldable display, with the bend limit layer being configured to increase its stiffness non-linearly when a radius of a bend of the bend limit layer is less than a threshold radius of curvature of the foldable display, the threshold radius of curvature being less than 3 mm. The hinge mechanism is configured to permit the second base portion to rotate about the hinge with respect to the first base portion by up to a maximum angle of 179 degrees when no torques are applied to the hinge mechanism, other than torques due to gravitational forces on elements of the computing device and forces that hold the device in a stationary position when resting on a flat surface in an unfolded configuration.

In another aspect, a computing device includes memory configured for storing executable instructions, a processor configured for executing the instructions, a spine member, where the spine member includes the memory and the processor, and a plurality of display pages, each display page coupled at a first edge of the page to the spine member and having a second edge, opposite the first edge that is free to rotate about an axis defined by the spine member, wherein at least one page includes two separately controllable OLED displays on opposite sides of the page.

DETAILED DESCRIPTION

Figure 1:
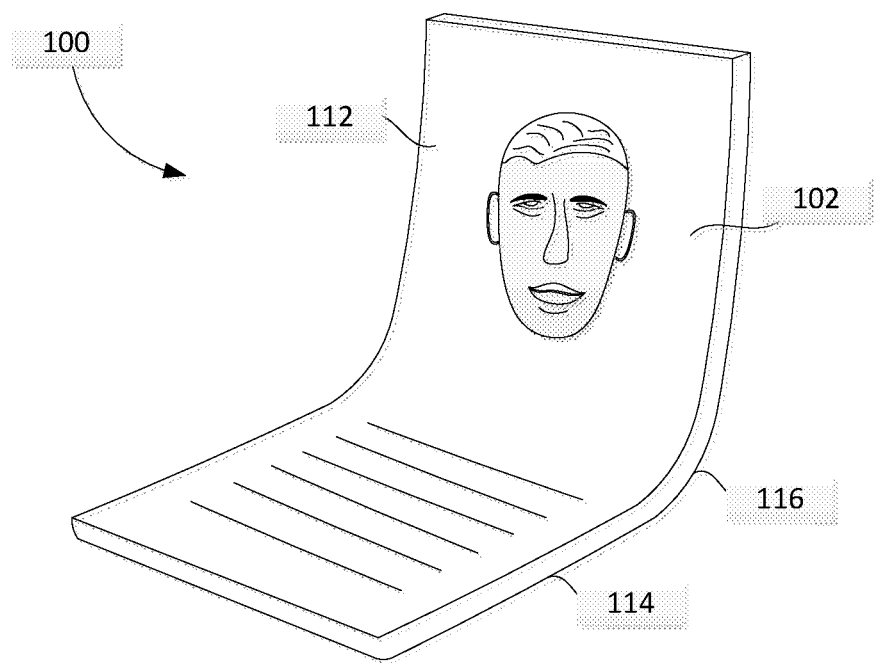
FIG. 1 is a perspective view of a computing device that includes a foldable display with the foldable display in a partially folded configuration.
Figure 2:
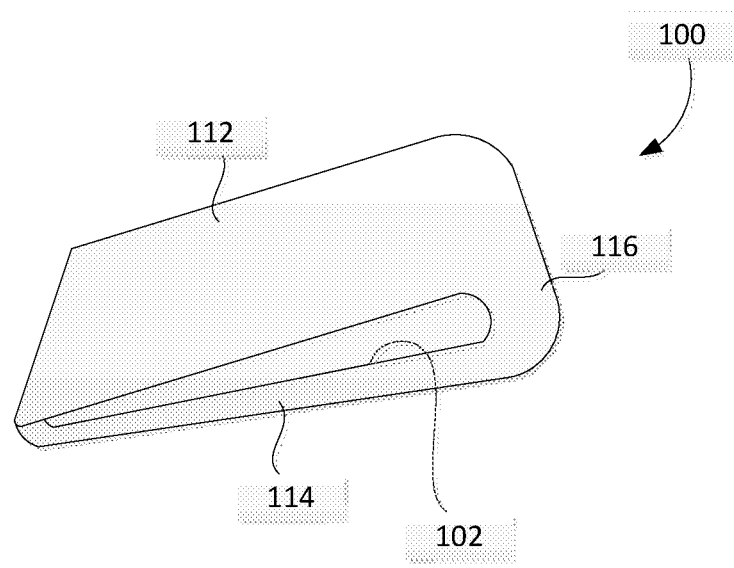
FIG. 2 is a perspective view of the computing device, with the display in a folded configuration.

FIG. 1 is a perspective view of a computing device 100 that includes a foldable display 102, with the foldable display in a partially folded configuration. The device 100 has the foldable display 102 mounted so that it folds with the viewable face inward. It is also possible to mount the foldable display 102 on the opposite side of device 100 so that the display folds with viewable face outward (not shown). FIG. 2 is a perspective view of the computing device 100, with the display 102 in a folded configuration. The foldable display 102 may be, for example, a TFT (Thin-Film-Transistor) OLED (Organic Light Emitting Diode) display, or other appropriate display technology. The foldable display 102 may comprise appropriate circuitry for driving the display to present graphical and other information to a user.

As shown in FIG. 1 and FIG. 2, the foldable display 102 can include a first flat rigid section 112, a second flat rigid section 114, and a third bendable section 116. In some implementations, the foldable display 102 can include more than two flat rigid sections 112, 114 and more than one bendable section 116. In some implementations, the foldable display 102 can include zero, or only one, flat rigid section 112, 114. For example, when a foldable display 102 includes zero flat rigid sections, the display 102 can be continuously bendable, and can be rolled up, as in a scroll. The foldable display 102 shown in FIG. 1 and FIG. 2 has a bendable section 116 that allows the foldable display to bend about an axis. In other implementations, the foldable display 102 can include bendable sections that allow the display 102 to bend about more than one axis.

The bendable section 116 of the foldable display 102 allows the display 102 to bend in an arc that has a radius, and the bendable section can be made to become rigid when the radius of the bendable section reaches a specified minimum radius. This minimum radius may be selected to prevent the display from bending in a radius so small that fragile components of the display would be broken. In some implementations, the minimum radius is greater than or equal to 2.5 millimeters, or greater than or equal to 3.0 millimeters, or greater than or equal to 5 millimeters. Thus, the bendable section can be flexible when bent in a radius greater than the minimum radius and then become rigid when the bend radius is equal to or smaller than the minimum radius.

Modern semiconductor-based displays are generally formed from a multi-layer stack of components. The components of the stack have different as-fabricated properties, including stresses and strains that exist in the component when the layer is fabricated. Additional stresses strains can be induced in the layers of the stack when the display is bent into a configuration that is different from the configuration in which the layer was fabricated. For example, if the layer was flat when it was fabricated, then additional strain can be induced by bending the layer, and if the layer was fabricated in a curved configuration, then additional strain can be induced by flattening the layer. If the bend-induced strain exceeds a threshold value characteristic of a component of the stack, the component can be damaged by the strain due to plastic deformation, cracking, buckling, delamination, etc. This characteristic damage threshold strain may be different depending on temperature, humidity, required cycle life, and other use and environmental factors. Brittle inorganic layers of the stack can typically withstand less strain than inorganic layers before they are damaged by the strain. Nevertheless, organic materials in the stack also can be damaged by excessive strain that is induced by bending.

Figures 3, 4:
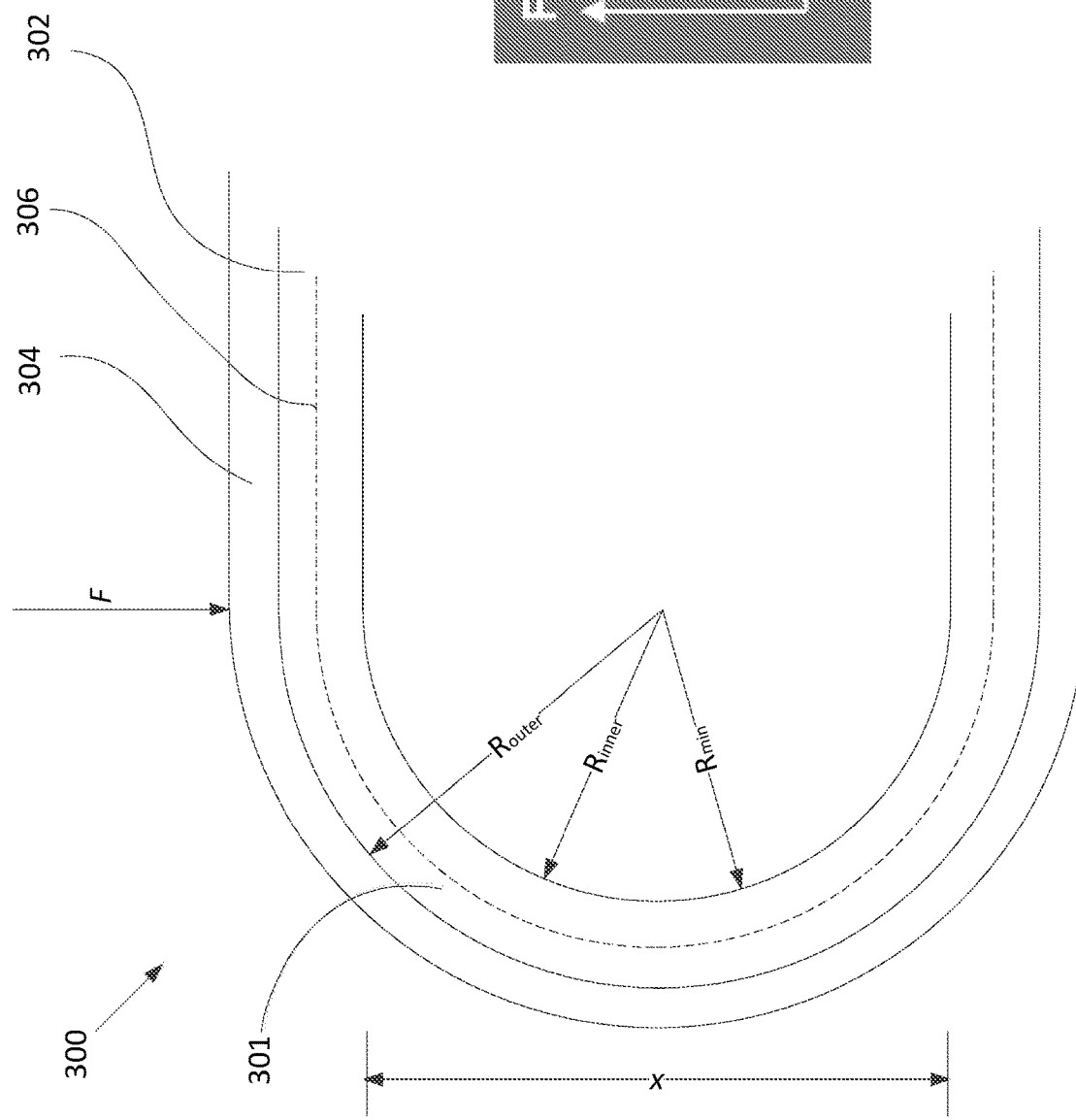
FIG. 3 is a schematic diagram of a fold-in foldable display having a bendable section that is bent around a minimum radius, Rmin.
FIG. 4 is a graph showing an example stiffness curve for a foldable display in which the limit radius is reached when the foldable display is folded.

FIG. 3 is a schematic diagram of a foldable display 300 having a bendable section 301 (the curved portion shown in FIG. 3) that is bent around a minimum radius, $R_{min}$. The foldable display 300 can include a display layer 302 that includes components (e.g., OLED layers, TFT layers, touch screen layers, polarizing layers, encapsulation layers, etc.) that generate images on the display (emitted from the side of the display that faces toward the inside of the bend) and that protect the image generating layers, and a bend limit layer 304 that limits the radius at which the foldable display 300 can bend to greater than or equal to the minimum radius, $R_{min}$.

When the display layer 302 is fabricated in a flat configuration, then bending the display layer 302 in the absence of the bend limit layer 304 may cause the bendable section to assume a radius less than the minimum radius, $R_{min}$ and induce excessive strain within the display layer 302. For example, compressive strain will be induced along the inner radius of the bend, $R_{inner}$, and tensile strain will be induced along the outer radius of the bend, $R_{outer}$. The display layer 302 can be approximately characterized by a plane at which no strain is induced when the display layer 302 is bent. This plane is referred to herein as the "neutral plane" 306. If the stack of materials within the layer 302 is symmetrical about a midplane of the layer, then the neutral plane corresponds to the midplane of the layer. However, different material properties (e.g., thickness, Young's modulus, etc.) of different layers within the display layer 302 can cause the neutral plane to be displaced above or below the midplane of the layer 302. The location of the neutral plane within the layer 302, along with the maximum tolerable strain values of the materials within the layer 302, determines the minimum bend radius that can be tolerated without causing damage to components within the layer 302.

The bend limit layer 304 can be attached to the display layer 302 to provide support for the display layer 302 and also can prevent the display layer from being bent around a radius that is smaller than its minimum tolerable bend radius. The bend limit layer 304 can be relatively flexible when it bent in radii greater than $R_{min}$ and then can become stiff and inflexible when the radius of the bend approaches, or matches, $R_{min}$. Stiffness can be parameterized by the change in bend radius per unit of applied force that causes the foldable display 300 to bend. For example, in FIG. 3, when the display is folded in half around a 180 degree bend, twice the radius of the bend is shown by the parameter, x, when a force, F, is applied to bend the foldable display. The stiffness of the foldable display 300 then can be parameterized by the derivative, $k=dF/dx$. The strength of the foldable display can be characterized as the maximum force, F, that the foldable display 300 can withstand before k suddenly decreases and failure of the display occurs.

When the foldable display 300 is laid flat in its folded configuration and is maintained in its folded configuration by the force of gravity on the upper folded portion of the display, zero additional force is needed to be applied to the upper folded portion to maintain the foldable display in its flat folded configuration. In this configuration the radius of the bend can be defined as the limit radius, $R_{limit}$, i.e., the radius at which the bend limit layer 304 limits the further bending of the foldable display unless additional external force is applied. To bend the foldable display further from this configuration requires additional external force to overcome the stiffness of the bend limit layer. Thus, an example stiffness curve for a foldable display in which the limit radius is reached with the foldable display is folded 180 degrees, showing stiffness as a function of x is shown in FIG. 4.

It can be advantageous to have a foldable display with a stiffness curve that exhibits a relatively sharp increase in stiffness once the limit radius is reached, such that the foldable display can be easily folded into its folded configuration in which $R_{limit}$ is close to $R_{min}$, and then the foldable display will become quite stiff, such that it remains in this configuration despite forces pressing it toward a radius smaller than $R_{limit}$.

Figure 5:
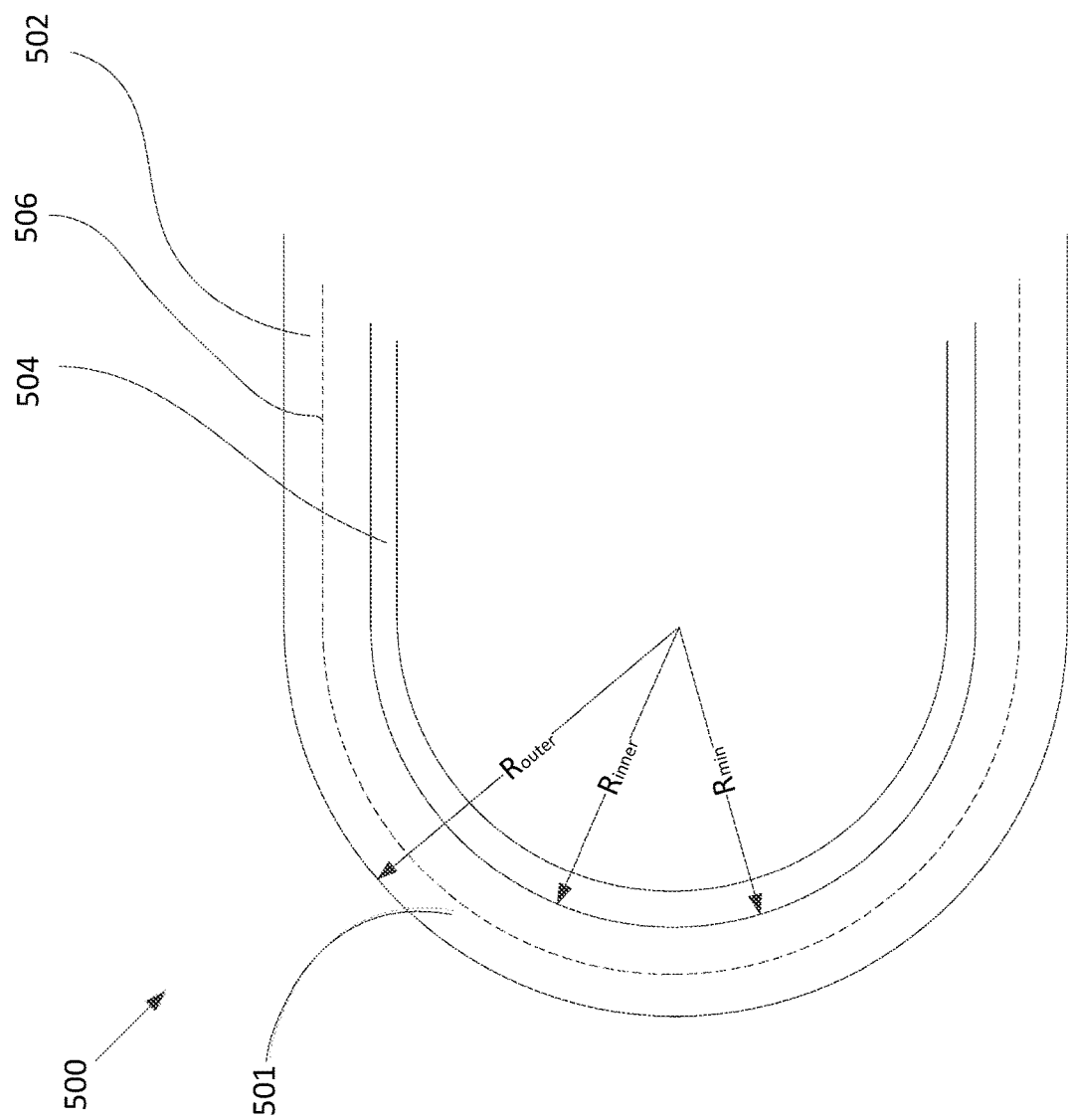
FIG. 5 is a schematic diagram of a fold-out foldable display having a bendable section that is bent around a minimum radius, Rmin.

The bend limit layer 304 is shown on the outside of the bend in FIG. 3, but also can be on the inside of the bend, for example, as shown in FIG. 5, in which case the content displayed by the display is on the outside of the bend.

Figure 6:
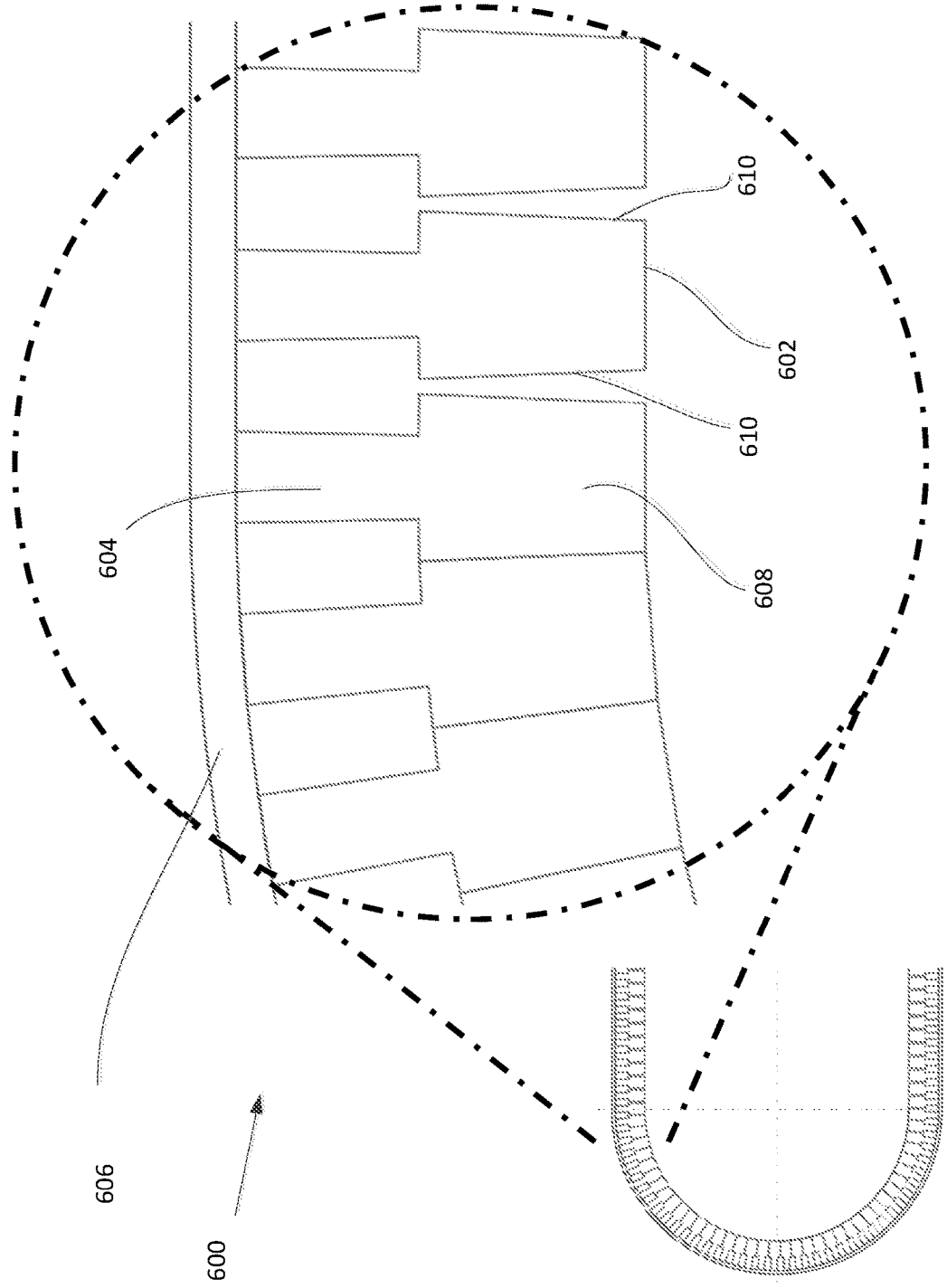
FIG. 6 is a schematic diagram of an example implementation of a bend limit layer.

FIG. 6 is a schematic diagram of an example implementation of a bend limit layer 600. The bend limit layer 600 can include a plurality of adjacent segments 602 that are each separated from neighboring segments for $R > R_{limit}$ and that are in contact with neighboring segments when $R \leq R_{limit}$. Each segment 602 can have a base portion 604 that is attached to a thin film 606 and a head portion 608 that is wider in a direction parallel to the plane of the bend limit layer 606 than the base portion 604. For example, the thin film 606 can be bent in radii of less than 3 mm. The thin film 606 has a thickness that is small compared with the height of the segments 606 in a direction perpendicular to the thin film 606. The stiffness of the thin film 606 is low, so that the bend limit layer 606 is easily bent for radii $R \geq R_{limit}$. The thin film 606 can be bent in radii small enough to accommodate the design parameters of the bend limit layer 600. In one non-limiting example, the thin film 606 can have a thickness of about 50 μm and when bend into a radius of 2.5 mm can experience a 1% strain. Of course, the thickness of the material can be adjusted to trade off advantages between different parameters, for example, the minimum radius of the thin film can be bent into, the strength of the thin film, and the stiffness of the thin film.

In the example implementation shown in FIG. 6, the bond line between the base portions 608 and the thin film 606 covered by 50% of one surface of the thin film 606. In other words, half of the surface of the thin film 606 is attached to base portions 604 of adjacent segments 602, and half of the surface is unattached. Other configurations are also possible, in which the bond line coverage is more or less than 50%. The portion of the thin film 606 that is bonded to the adjacent segments 602 is much stiffer than the portions that are not bonded. This increases the stain in the unbonded portions of thin film 606, and this increase must be accounted for in the materials and geometry of the bend limit layer 600.

The head portion 608 of each segment 602 can have vertical sides 610 that, when the bend limit film 606 is flat, are not perfectly perpendicular to the thin film 606, but rather that are angled toward each other as they extend away from the thin film 606. Then, when the bend limit layer 606 is bent into a radius equal to $R_{limit}$ the vertical sides 610 of adjacent segments 602 become in intimate contact with, and parallel to, each other, so that they form a rigid, rugged layer of material that has a high stiffness for $R \leq R_{limit}$. Some means of fabricating the head portion 608 of each segment 602 may not have perfectly flat sides, but instead have other surface geometries that also allow both faces of adjacent segments 602 come in intimate contact with each other, so that they form a rigid, rugged layer of material that has a high stiffness for $R \leq R_{limit}$.

Figure 7:
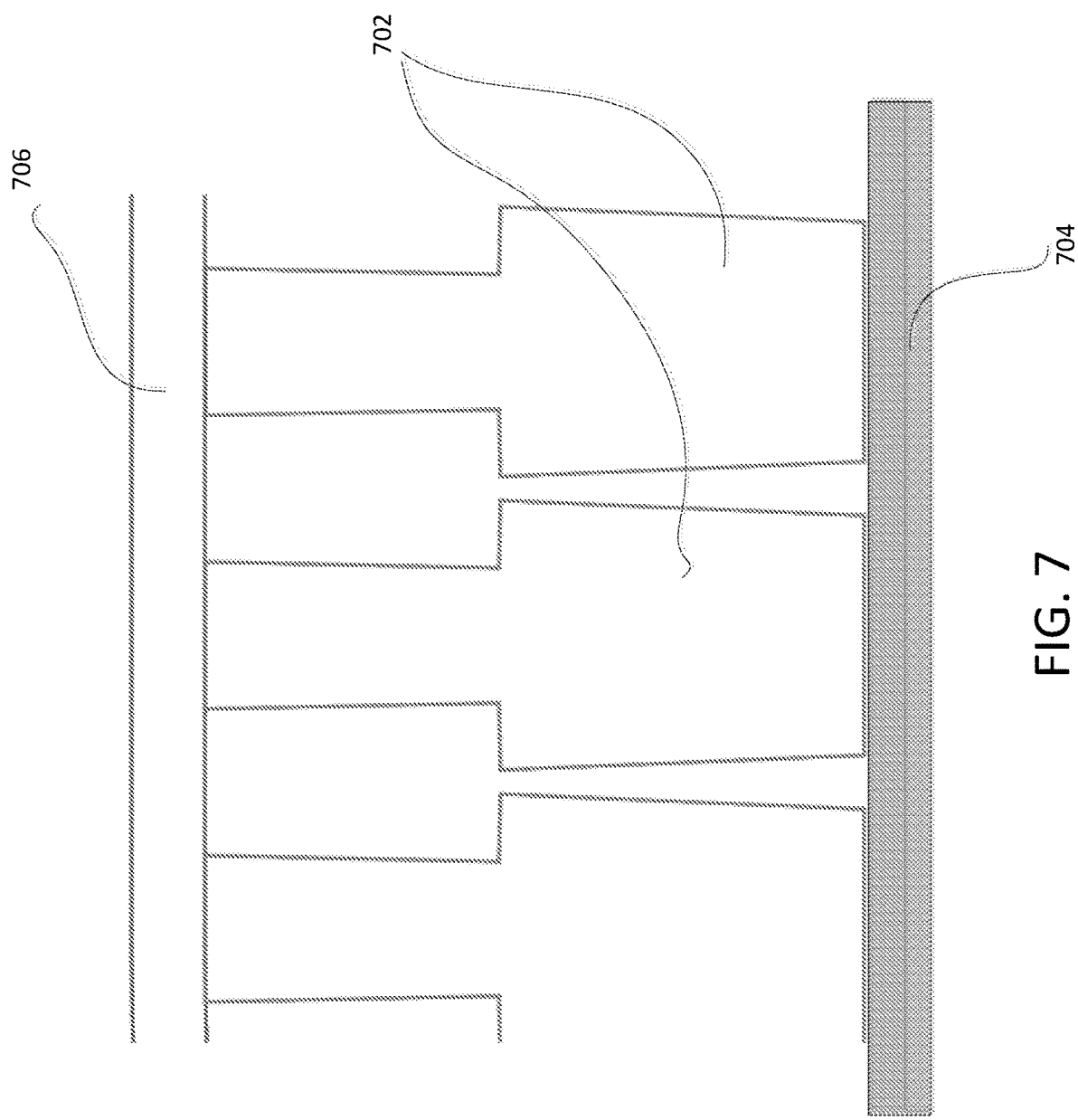
FIG. 7 is a schematic diagram of a plurality of adjacent segments for use in a bend limit film.

The segments 602 can be formed from a number of different materials including, for example, metals, polymers, glasses, and ceramics. Individual blocks can be molded, machined, drawn (e.g., through a shaped wire) and then attached to the thin film 606 at the correct spacing. In another implementation, a plurality of adjacent segments 602 can be formed simultaneously and then attached to the thin film 606. For example, as shown in FIG. 7, a plurality of adjacent segments 602 can be formed on a substrate 702, for example, by a single- or multi-step molding process, and then, after the segments 602 are bonded to the thin film 606, the substrate can be broken, dissolved, or otherwise removed from the segments 602. In another implementation, the plurality of adjacent segments 602 can be formed on a substrate 702, for example, by a lithography and etching process, and then, after the segments 602 are bonded to the thin film 606, the substrate can be broken, dissolved, or otherwise removed from the segments 602.

Figure 8A:
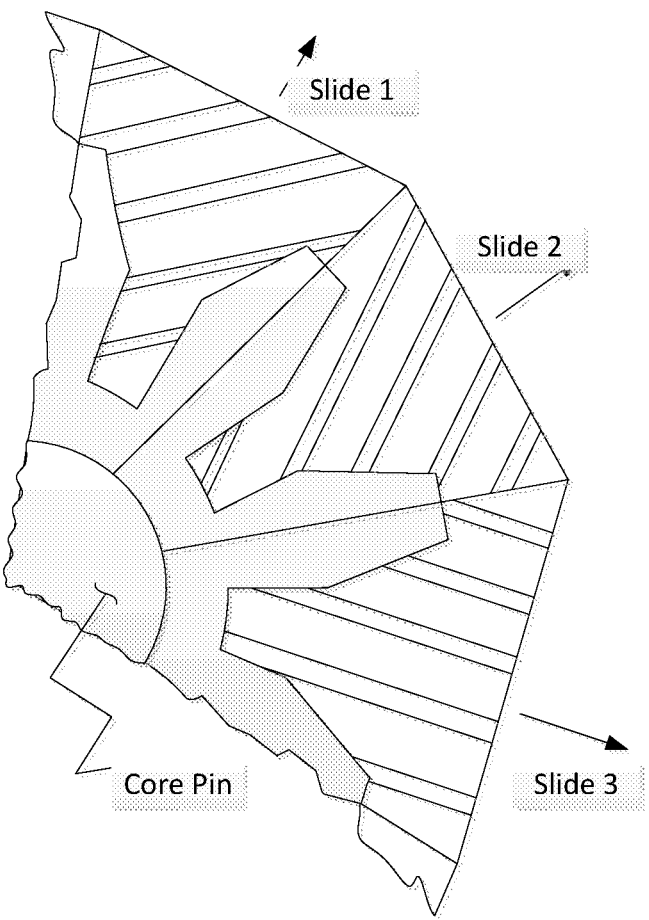
FIG. 8A is a schematic diagram of a rotating mold that can be used in an example molding process for forming the adjacent segments.
Figure 8B:
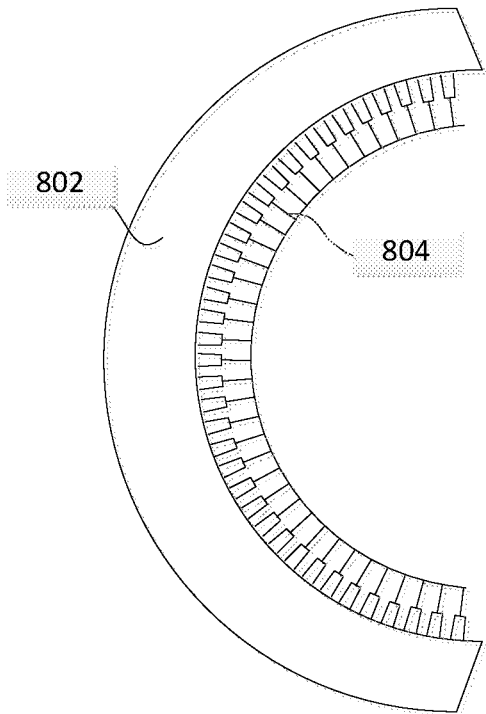
FIG. 8B is a schematic diagram of a mold that can be used for forming adjacent segments of a bend limit layer.

FIG. 8 is a schematic diagram of a rotating mold that can be used in an example molding process for forming the adjacent segments 602. For example, slides 1, 2, 3, etc. can be inserted radially into position with respect to a core pin, and then material can be injected into the voids between the slides and the core pin to simultaneously form the segments 602 and the thin film 606. As segments 602 are formed, the assembly can be rotated counter-clockwise and the slides removed in numerical order to free segments from the counter-clockwise-most position in FIG. 8 while new segments are formed in positions clockwise from the counter-clockwise-most position. By using transparent tooling and an ultra-violet (UV) rapid-curing molding compound, high production throughput can be achieved.

FIG. 8A is a schematic diagram of a mold 802 that can be used for forming adjacent segments 602 of a bend limit layer 804. The shape of the mold 802 can correspond to the shape of the bend limit layer 804, when the bend limit layer is in its designed limit radius configuration. Then, the adjacent segments 602 of the bend limit layer 804 can be formed as a unified part within the mold 802, however, with imperfections along the designed boundaries between adjacent segments 602. The imperfections then can allow the unified part to be cracked along the designed boundaries between the adjacent segments, so that after the bend limit layer 804 is removed from the mold and flattened the bend limit layer 804 has the separated adjacent segments 602 shown in FIG. 6, but when the bend limit layer 804 is bent to its limit radius, the adjacent segments form strong, rugged contacts to their adjacent segments.

Figure 9:
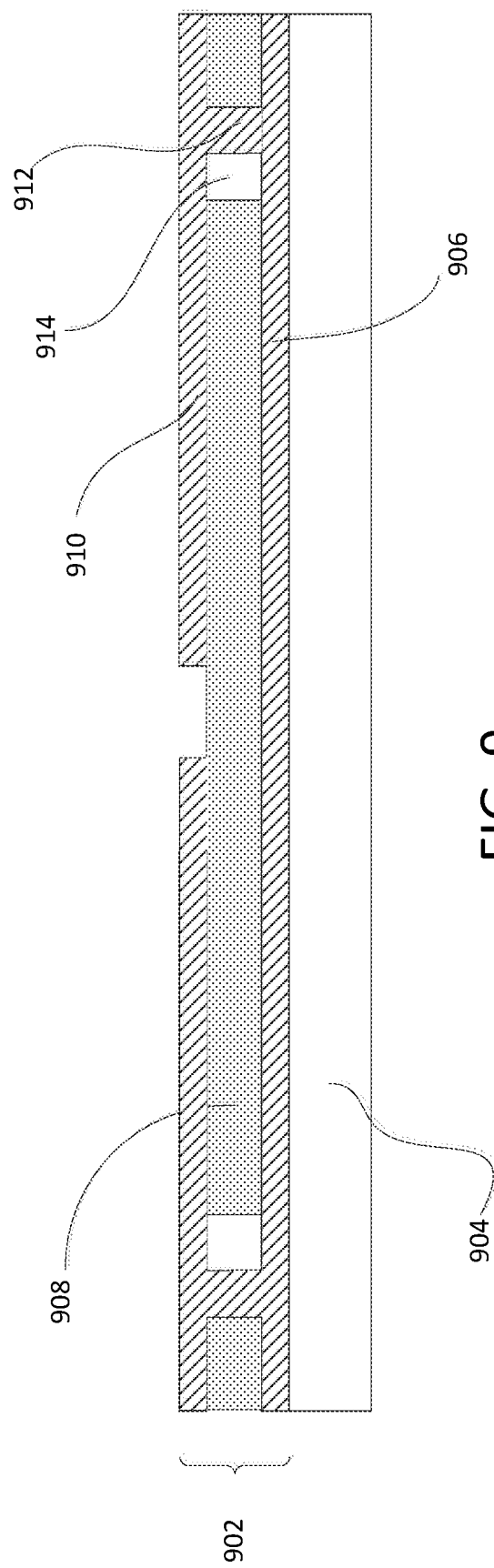
FIG. 9 is a schematic diagram of another implementation of the foldable display, in which a bend limit layer is coupled to a display layer.

FIG. 9 is a schematic diagram of another implementation of the foldable display 900, in which a bend limit layer 902 is coupled to a display layer 904. The bend limit layers 902 can include a plurality of sublayers. The sublayers can include, for example an outer layer 906, a middle layer 908, and an inner layer 910. The inner layer 910 can include one or more fingers 912 that extends outward toward the outer layer 906 and that, when the bend limit layer 902 is in a relaxed, unbent configuration, are each horizontally separated by a gap 914 in the plane of the layers from a portion of the middle layer 908 that is closest to the middle of the bend into which the bend limit layer 902 can be bent. Two fingers 912 and gaps 914 are shown in FIG. 9, but any number of fingers and corresponding gaps is possible.

Figure 10:
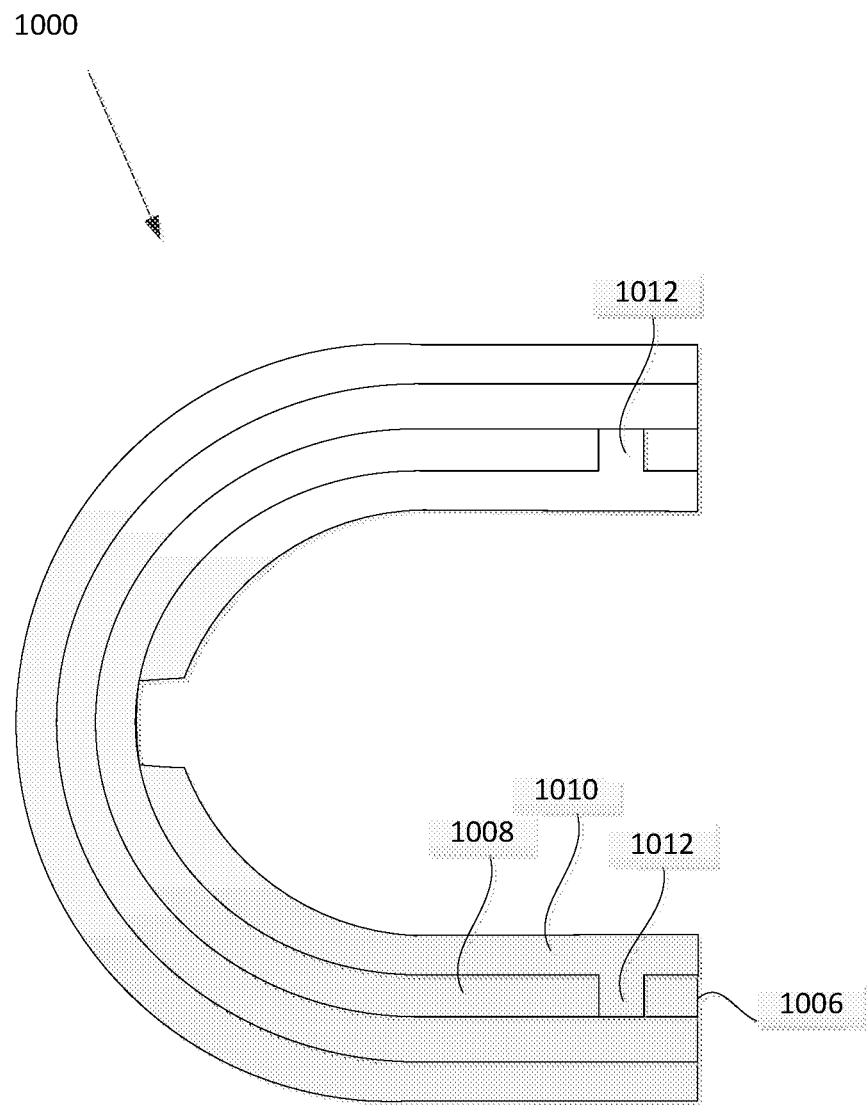
FIG. 10 is a schematic diagram of the foldable display of FIG. 9 when it is in a bent configuration.

FIG. 10 is a schematic diagram of the foldable display 900 when it is in a bent configuration. As shown in FIG. 10, compressive strain on the inner layer at the apex of the bend due to the bending of the foldable display causes the gaps 914 between the fingers 912 of the inner layer and the middle layer to be closed. Thus, the sections of the inner layer 910 can act as leaves that move across the inner layer in response to the compressive strain and that pull their corresponding fingers with them. When the gaps 914 are closed, the stiffness of the bend limit layer 902 increases, so that further bending of the foldable display is restricted.

Figure 11:
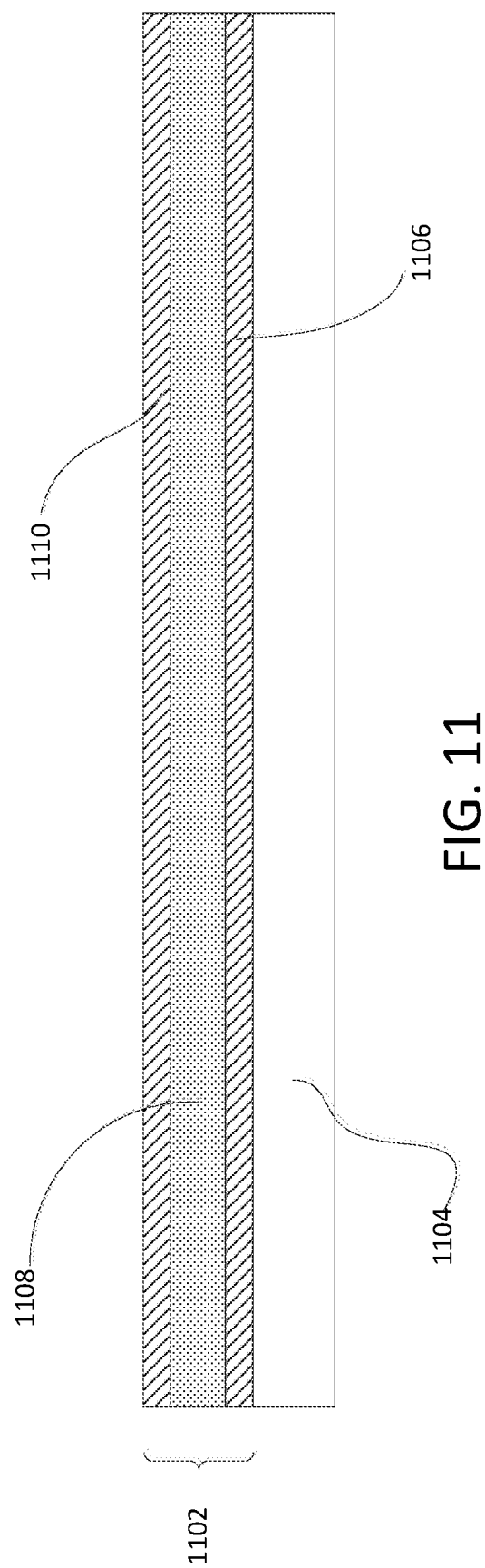
FIG. 11 is a schematic diagram of another implementation of a display in which a bend limit layer is coupled to a display layer.

FIG. 11 is a schematic diagram of another implementation of the display 1100 and which a bend limit layer 1102 is coupled to a display layer 1104. The bend limit layers 1102 can include a plurality of sublayers. The sublayers can include, for example, an outer skin layer 1106, a middle layer 1108, and an inner skin layer 1110. The layers can be made of different materials. In one implementation, the inner and outer layers 1110, 1106 can be made of very thin layer of a material with very high elongation (e.g. Nitinol film), and the middle layer can be made of material whose stiffness changes as a function of the bend radius of the foldable display 1100.

Figure 12:
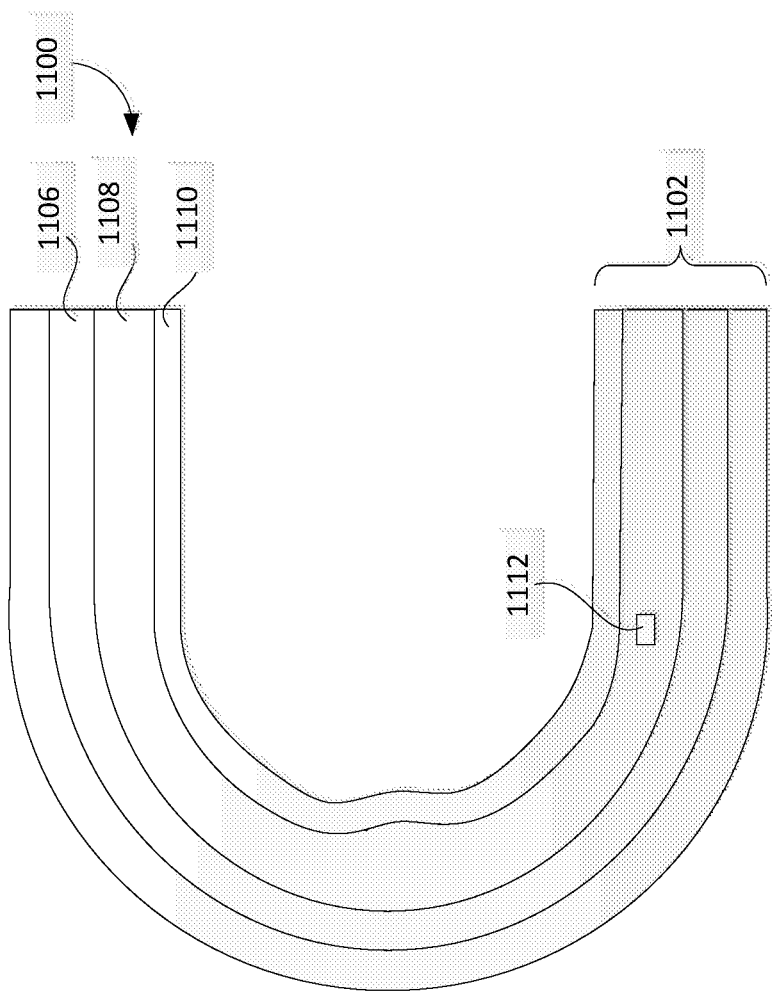
FIG. 12 is a schematic diagram of the foldable display of FIG. 11 when it is in a bent configuration.

FIG. 12 is a schematic diagram of the foldable display 1100 when it is in a bent configuration. As shown in FIG. 12, compressive strain on the inner layer 1108 due to the bending of the foldable display causes the stiffness of the middle layer 1108 to increase. This can occur in a number of different ways. In one implementation, the compressive strain on the inner layer 1110 and the middle layer 1108 causes the layers 1110, 1108 to deform inward toward the center of the bend, and the deformation of the material can increase the stiffness of the materials in the layers. In another implementation, the compressive strain on the inner layer 1110 and the middle layer 1108 causes a changes of state of an electromechanical device (e.g., a piezoelectric device) 1112 within at least one of the layers 1110, 1108 and a signal due to the change of state can be used to cause a change in the stiffness of the middle layer 1108. For example, an electrical signal from the electromechanical device 1112 in response to the bend-induced strain can trigger an electrical current or a voltage to be applied to the materials in the middle layer, which, in turn, can cause a change of state and stiffness of the material in the middle layer. For example, the material can change from a liquid to a solid in response to the applied current or voltage, or material can be pumped into the bent portion of the middle layer, or the orientation of particles of material can be rearranged in response to the applied current or voltage to increase the stiffness of the bent portion.

Figure 13:
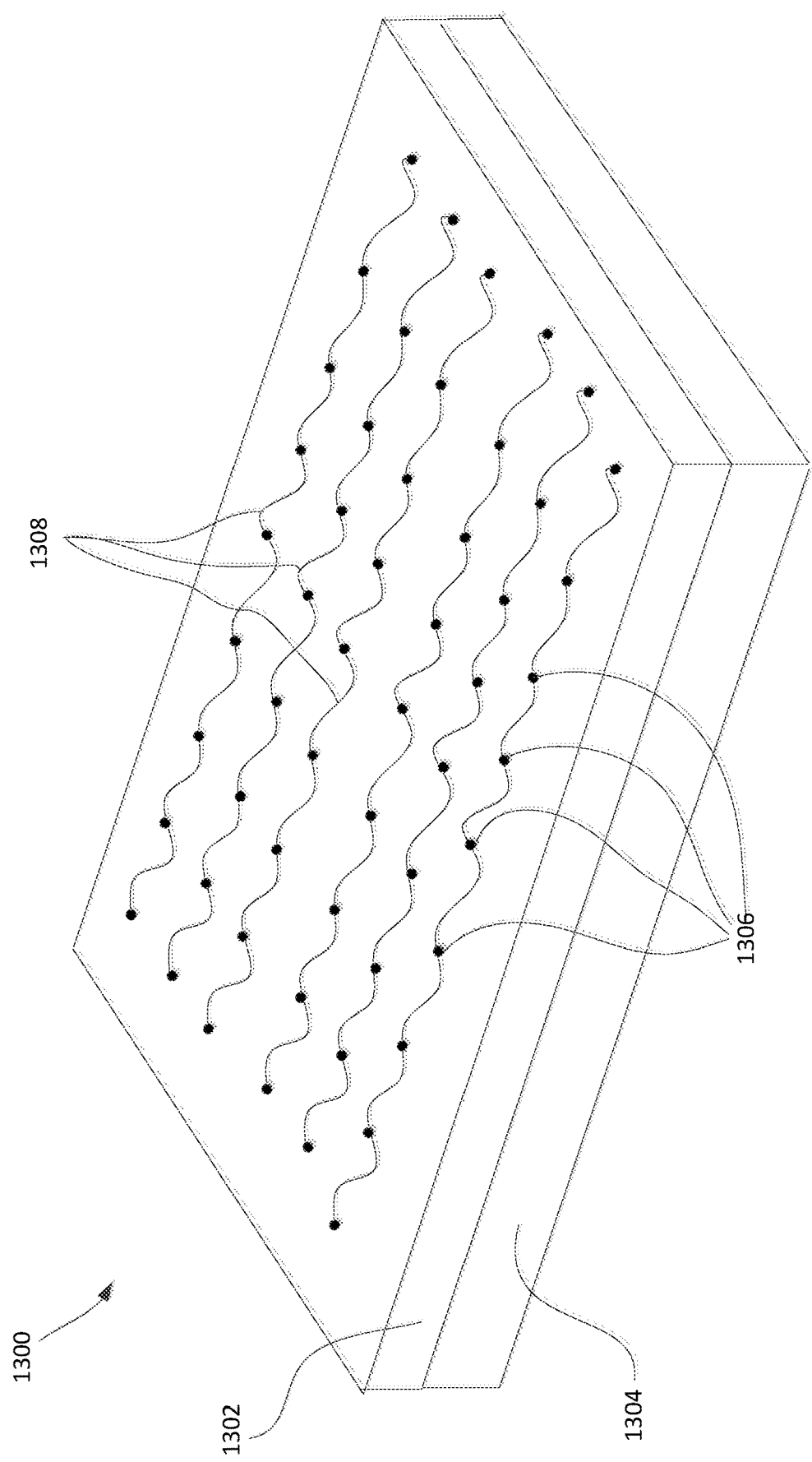
FIG. 13 is a schematic diagram of another implementation of a foldable display in which a bend limit layer is coupled to a display layer.

FIG. 13 is a schematic diagram of another implementation of the foldable display 1300 in which a bend limit layer 1302 is coupled to a display layer 1304. The content of the display can be displayed on a surface of the display that is on the opposite side of the foldable display 1300 from the bend limit layer 1302 (e.g., facing down, as shown in FIG. 13). The bend limit layer 1302 can include a plurality of threads or fibers arranged across the layer 1302 in a plane and that, when the bend limit layer 1302 is in a flat configuration, are arranged in a serpentine configuration, so that the length of each fibers is longer than the straight end-to-end distance in the plane between the ends of each fiber. The fibers can be made of strong, low-stretch material, such as, for example, fibers made from glass, Kevlar®, graphite, carbon fiber, ceramics, etc. and can be laid down in a low modulus substrate. For example, the fibers can be laid down via a spread tow technique in the desired pattern using specialized manufacturing equipment. In some implementations, the fibers can be pinned at locations 1306 along their lengths to a layer of the foldable display, e.g., to a substrate in the bend limit layer 1302 or to an surface at interface between the bend limit layer 1302 and the display layer 1304. For example, the fibers can be pinned at nodes of the serpentine configuration of the fibers. The pinning can be performed by a number of different techniques. For example, a laser heating process may bond the fibers at the pinning sites to the layer, or the fibers can be mechanically bonded at the sites.

The fibers can limit the bend radius of the foldable display 1300 when the display is bent, when the bend limit layer 1302 is on the outside of the bend and the display layer 1304 is on the inside of the bend, because the fibers can become straight and limit the bend radius of the foldable display when the desired minimum bend radius is reached. In other words, the resistance of the bend limit layer 1302 to tensile strain in the layer is very low while the fibers are unstretched and then becomes high when the fibers are stretched to their full lengths. With the fibers bonded to material in the bend limit layer 1302 at the pinning sites, a sudden increase in stiffness of the bend limit layer occurs when the bending of the bend limit layer 1302 causes the fibers to become straight between adjacent pinning sites 1306.

Figure 14:
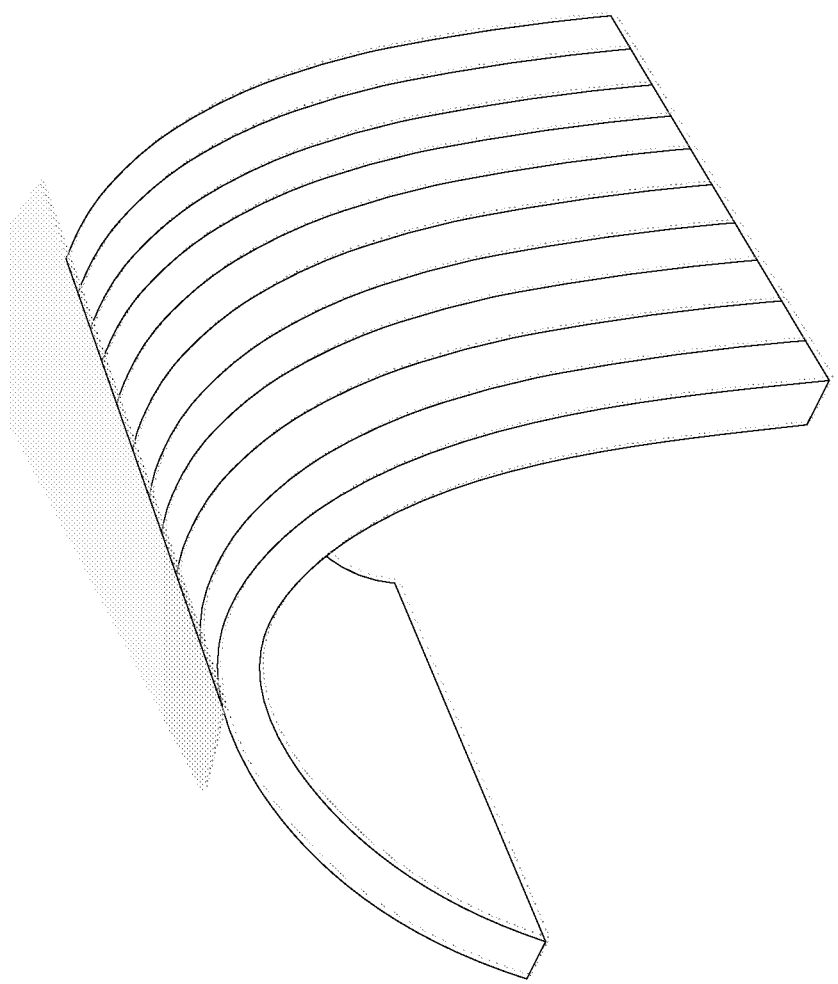
FIG. 14 is a schematic diagram of a foldable display of FIG. 13 when the display is in a bent configuration.

FIG. 14 is a schematic diagram of a foldable display 1400 when the display is in a bent configuration with the bend limit layer 1402 on the outside of the bend and with the display layer 1404 on the inside of the bend. In this configuration, when the bend limit layer is under tensile strain, the fibers can be become straight in the curved plane of the bend limit layer 1402, and the end-to-end distance, within the curved plane, of each fiber segment between adjacent pinning sites 1406 can be close to, or the same as, the length of each fiber between the adjacent pinning sites 1406. In this configuration the strong, low-stretch fibers resist the tensile strain on the bend limit layer, and thereby limit the bend radius of the foldable display 1400.

Figure 15:
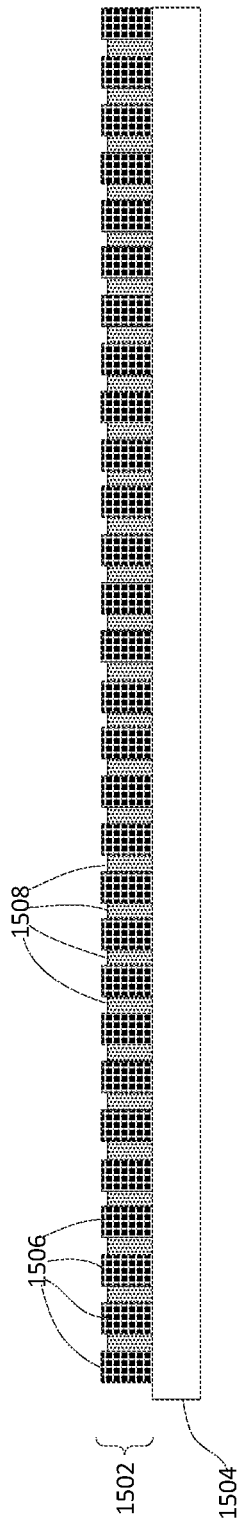
FIG. 15 is a schematic diagram of another implementation of a foldable display in which a bend limit layer is coupled to a display layer.

FIG. 15 is a schematic diagram of another implementation of the foldable display 1500, in which a bend limit layer 1502 is coupled to a display layer 1504. The bend limit layers 1502 can include a patterned structure of materials that can have a non-linear stiffness response to compressive forces caused by bending of the foldable display 1500.

In one implementation, the patterned structure can include an array of ribs 1506 that extend away from the display layer 1504. As shown in FIG. 15, the ribs 1506 can be rectangular shaped, but other shapes are also possible. The ribs 1506 can be relatively rigid, in that they have a high bulk modulus and a high shear modulus. Therefore, the ribs 1506 retain their shape when the foldable display 1500 is bent. The ribs can include a variety of different rigid materials, including, for example, metals (e.g., aluminum, copper, steel, etc.) ceramic materials, glass materials, etc.

Gaps or trenches 1508 between adjacent ribs 1506 can be partially or fully filled with a second material that has a non-linear stiffness response to compressive forces caused by bending of the foldable display 1500. The material can include a foam (e.g., and open cell foam), a gel, or other material whose bulk modulus changes as a function of the compressive forces on the material.

When the bend limit layer 1502 is in a relaxed, unbent configuration, as shown in FIG. 15, the material in the gaps 1508 between the ribs 1506 can exert a relatively low force on the ribs holding in place in the gaps, for example, because in the unbent configuration the material in the gaps 1508 is in an undeformed state and therefore the material exerts little for due to its compressibility. The distance between adjacent ribs at the distal ends of the ribs (i.e., away from the display layer 1504) can be approximately equal to the distance between adjacent ribs 1506 at the proximate ends of the ribs (i.e. closest to the display layer 1504).

Figure 16:
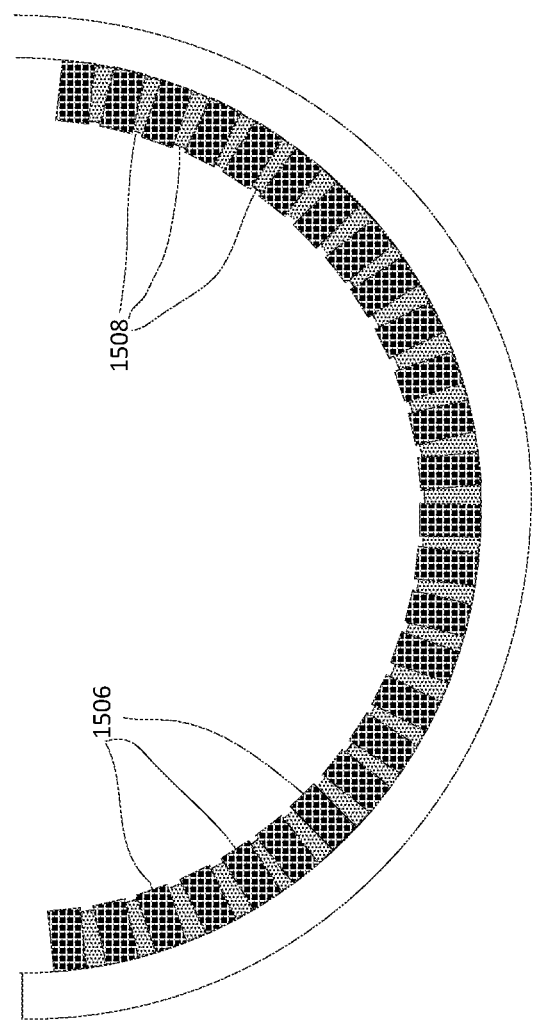
FIG. 16 is a schematic diagram of the foldable display when it is in a bent configuration.

FIG. 16 is a schematic diagram of the foldable display 1500 when it is in a bent configuration. As shown in FIG. 16, compressive strain in the bend limit layer 1502 layer can cause the distance between adjacent ribs 1506 at the proximate ends of the ribs to be less than when the bend limit layer 1502 is in its relaxed, unbent configuration. In addition, because of the bend of the bend limit layer 1502 and the non-zero length of the ribs the distance between adjacent ribs at the distal ends of the ribs 1506 is even shorter when the bend limit layer 1502 is in the bent configuration than when in the unbent configuration. Consequently, the material in the in gaps or trenches 1508 between the ribs 1506 is squeezed when the layer 1502 is bent. The squeezing of the material can cause a sudden increase in the stiffness of the material when the radius of the bend becomes less than a threshold radius. For example, in the case of an open cell foam material in the gaps 1508 between the ribs 1506, air can be squeezed of the cells when the material is compressed, and when a critical amount of air has been squeezed from the material when the radius reaches the threshold radius, then the stiffness of the material can suddenly increase.

Figure 17:
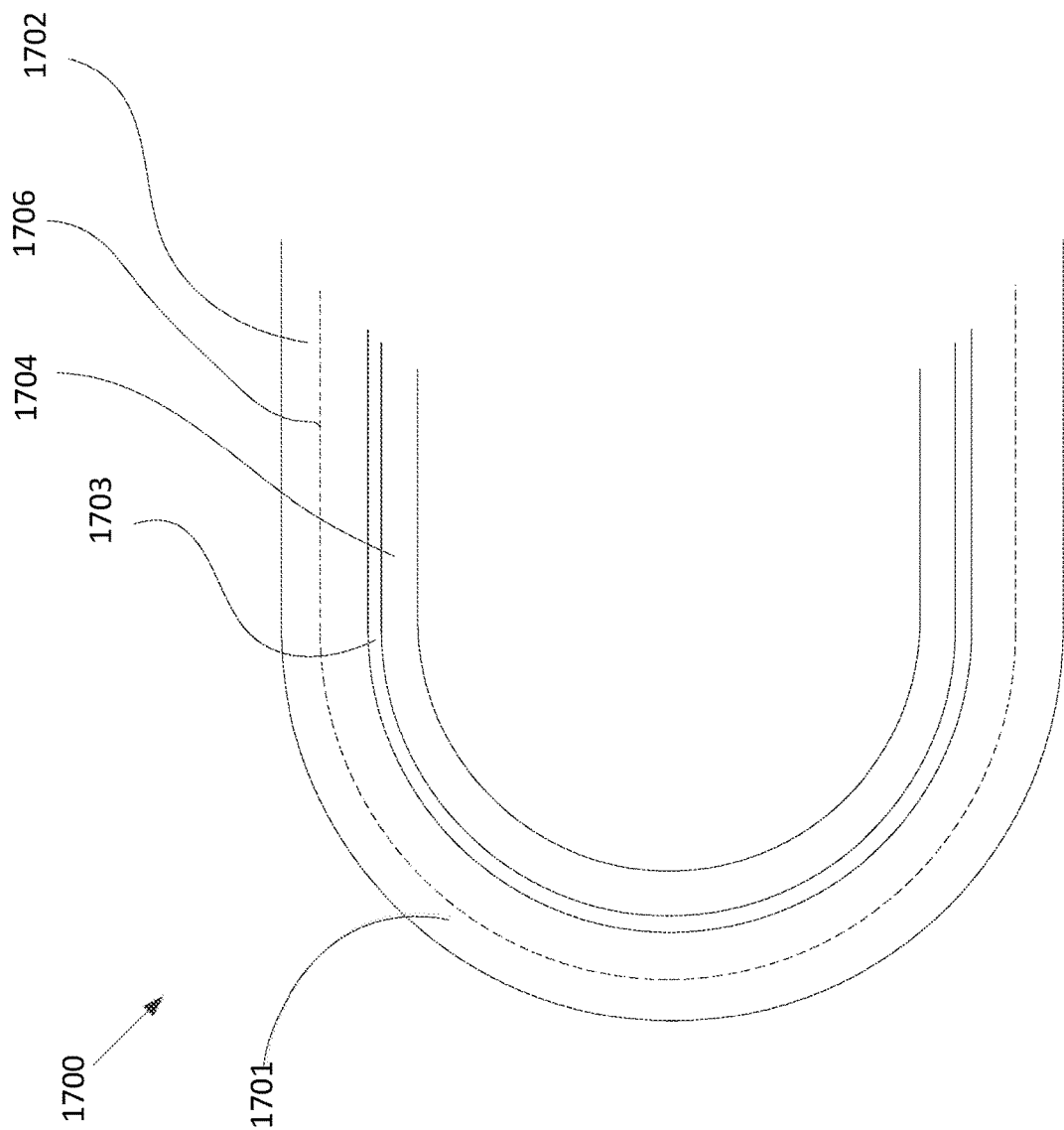
FIG. 17 is a schematic diagram of a foldable display having a bendable section that is bent around a minimum radius.

FIG. 17 is a schematic diagram of a foldable display 1700 having a bendable section 1701 that is bent around a minimum radius, $R_{min}$. The foldable display 1700 can include a display layer 1702 that includes components (e.g., OLED layers, TFT layers, touch screen layers, polarizing layers, etc.) that generate images on the foldable display and a bend limit layer 1704 that limits the radius at which the foldable display 1700 can bend to greater than or equal to the minimum radius, $R_{min}$. The bend limit layer 1704 is coupled to the display layer 1702 by a coupling layer 1703. The coupling layer 1703 can include, for example, an adhesive material or a bonding material on respective surfaces that touch the display layer 1702 and the bend limit layer 1704.

As described above, when the display layer 1702 is fabricated in a flat configuration, bending the display layer 1702 induces compressive strain along the inner radius of the bend, and tensile strain is induced along the outer radius of the bend. It is desirable to keep the neutral plane 1706 of the assembly, at which no stain occurs in response to the bending, at, or close to, the plane in which fragile and sensitive components of the assembly (e.g., TFTs) exist. Thus, the coupling layer 1703 can include low modulus material (e.g., rubber, gel, etc.), so that little strain within the planes of the layers is transmitted between the display layer 1702 and the bend limit layer 1704. In some implementations, the display 1700 can include an additional layer 1710 on the opposite side of the display layer 1702 from the bend limit layer and that functions to maintain the neutral plane close to its designed location within the display layer 1702 when the bend limit layer 1704 acts to limit the bend radius of the display 1700. For example the additional layer 1710 can have a stiffness that compensates for the effect of the stiffness of the bend limit layer on the position of the neutral plane, so that the neutral plane does not shift from its designed location in the display layer 1702 when the display layer 1702 is coupled to the bend limit layer 1704.

Figure 18:
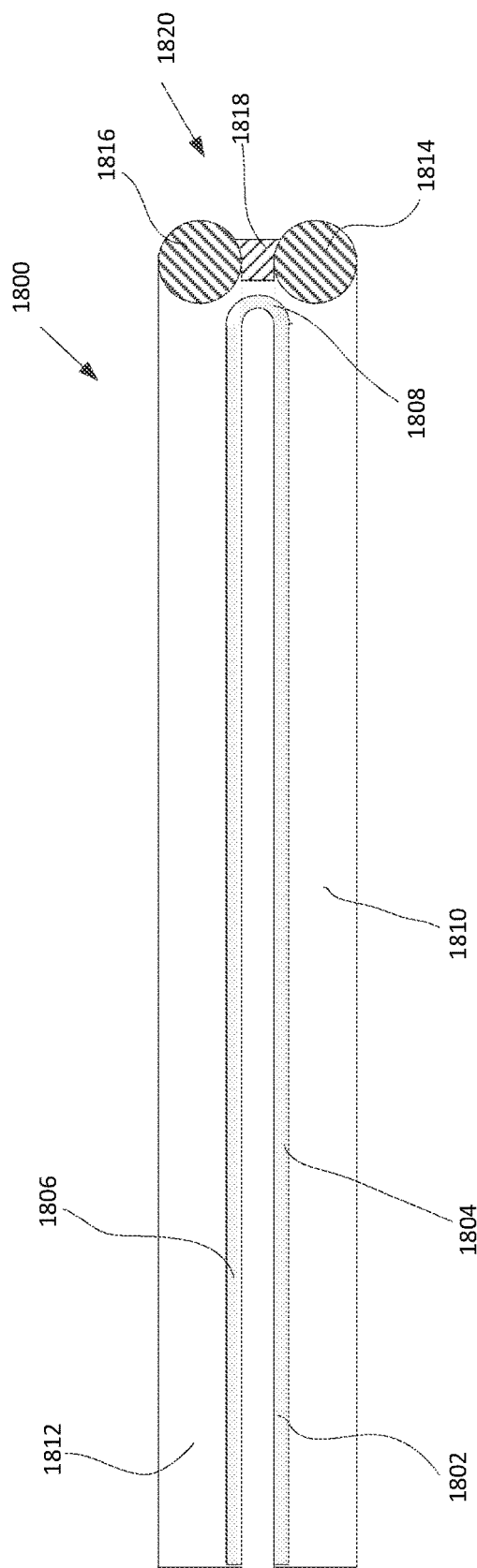
FIG. 18 is a schematic side view of a foldable computing device having a continuous foldable display when the device is in a folded configuration.
Figure 19:
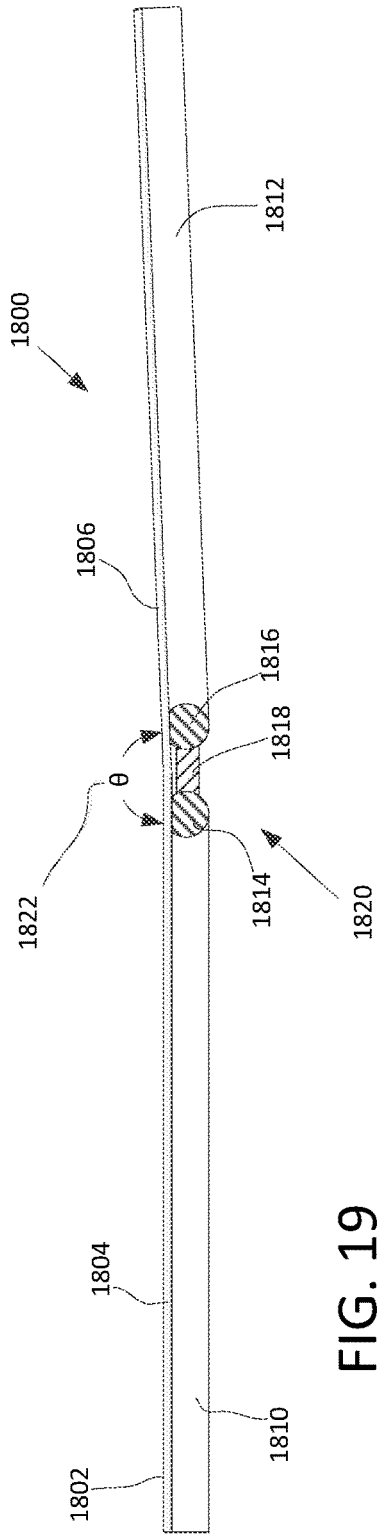
FIG. 19 is a schematic side view of the computing device of FIG. 18 when the device is in an unfolded configuration.

In some implementations, it can be desirable to provide a foldable display that does not unfold to a completely flat configuration, so that portions of the display on opposite sides of foldable portion, or hinge portion, of the display are distinguished for the user. FIG. 18 is a schematic side view of a foldable computing device 1800 having a continuous foldable display 1802 when the device is in a folded configuration, and FIG. 19 is a schematic side view of the computing device 1800 when the device is in an unfolded configuration. In some implementations, the continuous foldable display can include a bend limit layer to limit a bend radius of a portion of the foldable display.

The continuous foldable display 1802 can include a first straight section 1804, a second straight section 1806, and a bendable section 1808. The first straight section 1804 of the continuous foldable display 1802 can be coupled to a first base portion 1810 of the device 1800, and the second straight section 1806 of the continuous foldable display 1802 can be coupled to a second base portion 1812 of the device 1800. In some implementations, the continuous foldable display 1802 includes a bend limit film. In some implementations, the continuous foldable display 1802 does not include a bend limit film.

In some implementations, one or both straight sections 1804, 1806 of the continuous foldable display can be fixedly coupled to their respective base portions 1810, 1812. In some implementations, one or both straight sections 1804, 1806 of the continuous foldable display can be loosely coupled to their respective base portions 1810, 1812, such that one or both straight sections 1804, 1806 can move relative to their respective base portions 1810, 1812 (e.g., parallel to a surface of the straight section) as the device 1800 is moved between its folded and unfolded configurations. For example, a straight section can be loosely coupled to its respective base section by guides or tracks that allow the straight section to slide parallel to a surface of the straight section relative to its respective base section.

The first base portion 1810 and the second base portion 1812 can include components of the computing device 1800, such as, for example, a battery, a motherboard, processor, memory, a speaker, a microphone, a camera, circuitry for driving the display 1802, etc. The first base portion 1810 and the second base portion 1812 can be coupled to each other by a hinge mechanism 1820 that allows the device 1800 to articulate between its folded configuration shown in FIG. 18 and is unfolded configuration shown in FIG. 19. In some implementations, the hinge mechanism 1820 can include a dual hinge mechanism that includes a first rotational hinge 1814 and a second rotational hinge 1816 that are coupled together by a coupling member 1818. The first rotational hinge 1814 can be coupled to the first base member 1810, and the second rotational hinge 1816 can be coupled to the second base member 1812. The first base member 1810 can rotate about an axis of the first rotational hinge 1814, and the second base number 1812 can rotate about an axis of the second hinge member 1816. In addition, a first end of the coupling member 1818 can rotate about an axis of the first hinge member 1814, and a second end of the coupling number 1818 can rotate about an axis of the second hinge member 1816.

With the hinge mechanism 1820, the computing device 1802 can be unfolded from its folded configuration shown in FIG. 18 to its unfolded configuration shown in FIG. 19, where the unfolding can involve a rotation of close to, but less than, 180° of the second base member 1812, relative to the first base member 1810, about the hinge mechanism 1820.

The hinge mechanism 1820 can include a mechanical or electromagnetic stop mechanism that prevents the second straight section 1806 of the foldable display from being unfolded into in the same plane as the first straight section 1804 when the computing device 1800 is in its unfolded configuration and no torques are applied to the hinge mechanism 1820, other than torques due to gravitational forces on the elements of the computing device 1800 and forces that hold the device 1800 in a stationary position when resting on a flat surface in an unfolded configuration. For example, the stop mechanism can limit an angle 1822 between the first straight section 1804 and the second straight section 1806 to less than 180° when the computing device is in the unfolded configuration. In some implementations, the angle 1822 can be limited to less than 179°. In some implementations, the angle 1820 can be limited to less than 177.5°. In some implementations, the angle can be limited to less than 175°. In some implementations, the angle can be limited to less than 170°. In some implementations, the tolerance for the specified angle can be +/−three degrees when the device is subjected to a 10 Newton-centimeter moment about the hinge axis, including free play.

By limiting the angle 1822 to less than 180° when the computing device 1800 is in its unfolded configuration, a visual distinction can be maintained for a user of the device between the first straight section 1804 and the second straight section 1806 of the continuous foldable display 1802. Such a distinction may be desirable if the curved section 1808 of the continuous foldable display 1802 is susceptible to even to small deformations or imperfections due to the folding of the display. Such small deformations or imperfections in the continuous foldable display 1802 can be annoyingly evident to a user as a flaw in the device 1800, when the device 1800 is designed to be unfolded into a configuration in which the first straight section 1804 and the second straight section 1806 are substantially in the same plane as each other. However, when the first straight section 1804 and the second straight section 1806 are not in the same plane as each other with the device in its unfolded configuration, a user may find any imperfections or deformations of the curved section 1808 of the foldable display 1802 to be less noticeable or distracting.

In some implementations, the hinge mechanism 1820 can have some "give" to it, so that, even though the angle 1822 is less than 180° when the device 1800 is in an unfolded configuration and resting on a surface and no torque is applied about the hinge mechanism other than the torque due to the weight of the first and second base members 1810, 1812, when force is applied to ends of the base members that are distal to the hinge mechanism, the device 1800 can be placed into a configuration in which the first straight section 1804 is parallel to the second straight section 1806. That is, the force must be maintained to keep the device in a flat configuration. For example, the hinge mechanism 1820 can be configured to permit the second straight section 1806 to rotate about the hinge mechanism 1820 with respect to the first straight section 1804 by an angle of 180 degrees when a torque about the hinge mechanism, which can be applied by a human finger acting on the first and/or or second base portions, is applied to the device when the device is resting on a flat surface in an unfolded configuration.

In other aspect, a foldable display device can include a plurality of foldable displays, where the foldable displays are physically separated from each other. In some implementations, the different foldable displays can be arranged similar to pages of a book, with a bendable section of each foldable displays coupled to a portion of the device that may correspond to a spine portion of a book.

Figure 20:
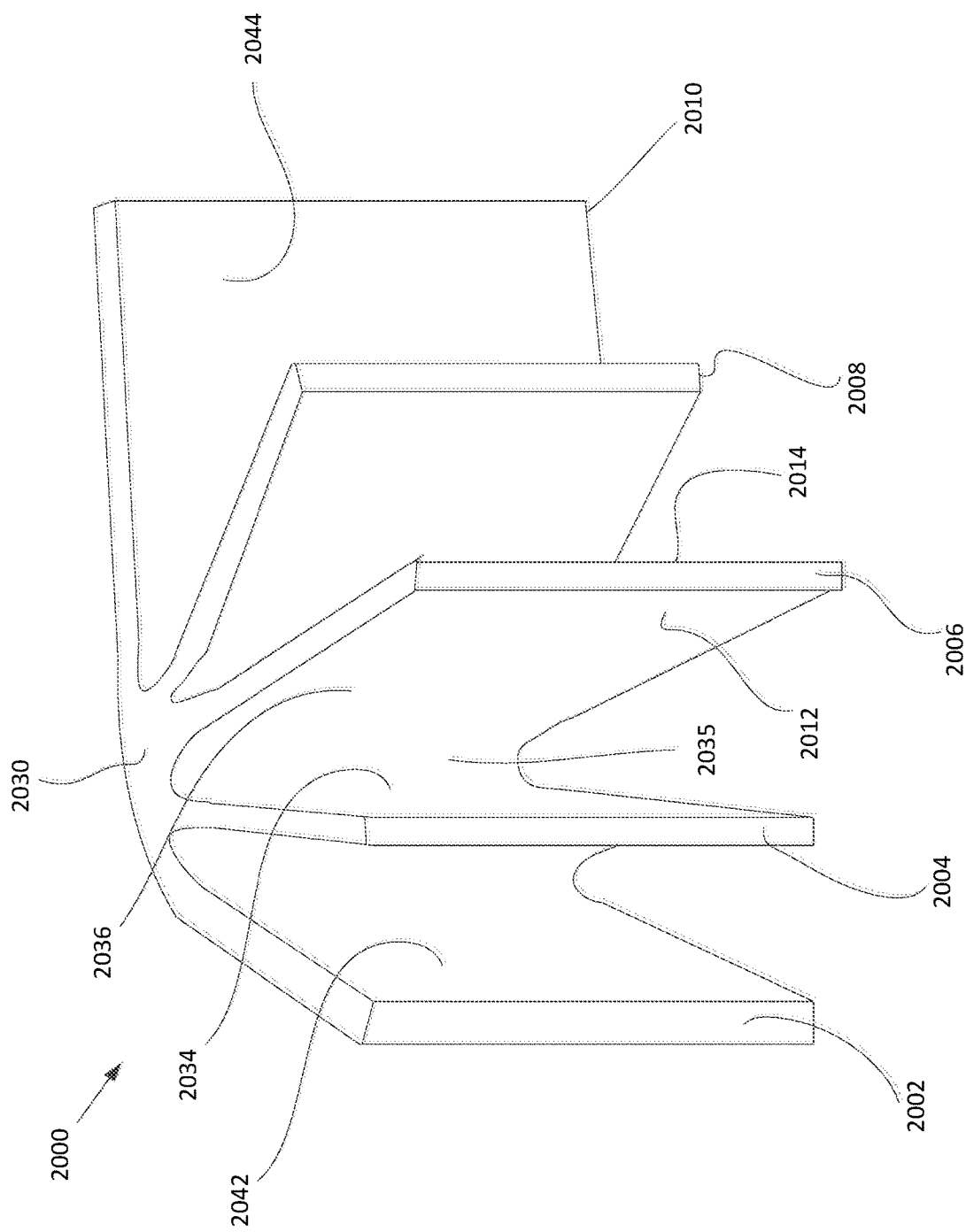
FIG. 20 is a schematic side perspective of a foldable computing device having a plurality of OLED display pages when the device is in a partially unfolded configuration.
Figure 21:
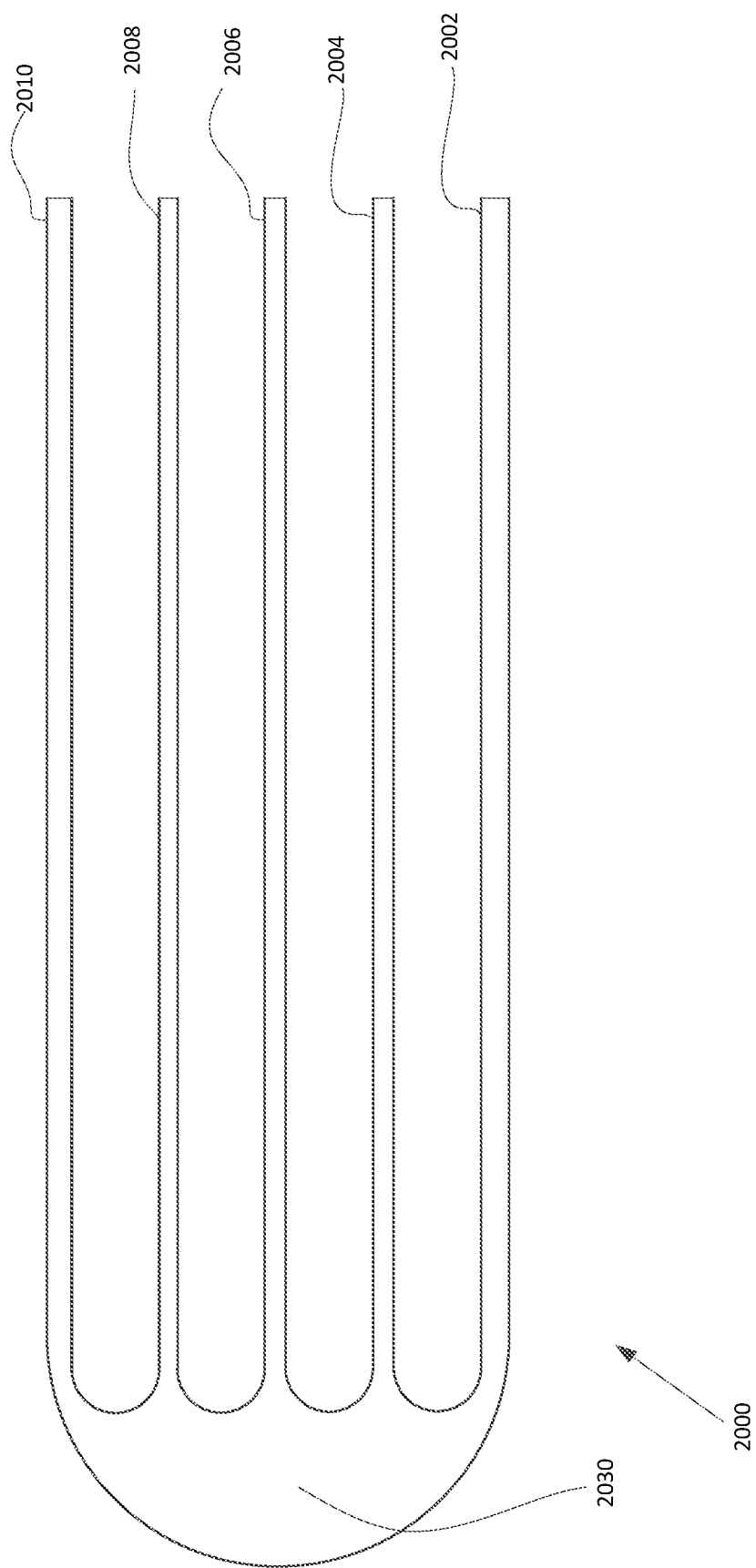
FIG. 21 is a schematic side view of the computing device of FIG. 20 when the device is in a folded configuration.

FIG. 20 is a schematic side perspective of a foldable computing device 2000 having a plurality of OLED display pages 2002, 2004, 2006, 2008, and 2010 when the device is in a partially unfolded configuration. FIG. 21 is a schematic side view of the computing device 2000 when the device is in a folded configuration. The pages 2002, 2004, 2006, 2008, and 2010 of the computing device 2000 can be arranged similar to pages of a book that are bound at one edge of the pages by a common spine. For example, first edges of the pages 2002, 2004, 2006, 2008, and 2010 can all be coupled to a spine portion 2030 of the computing device 2000, while second edges of the pages opposite from the first edges and distal to the spine portion 2030 are free to move independently of each other about the spine portion 2030. The number of pages in the foldable computing device 2000 need not be five, as shown in FIGS. 20 and 21, but rather, the computing device 2000 can include any number of pages.

The spine portion 2030 can include components of the computing device 2000, such as, for example, a battery, a motherboard, memory, processor, a speaker, a microphone, a camera, circuitry for driving the OLED pages 2002, 2004, 2006, 2008, and 2010, hinge mechanisms by which the pages can be moved, etc.

In some implementations, each page 2002, 2004, 2006, 2008 and 2010 can include first and second OLED display surfaces located on opposite surfaces of the page. In some implementation, corresponding to a fold-in bendable display, OLED display surfaces of different pages that face each other (e.g., surface 2034 of page 2004 and surface 2036 of page 2006) can be included as different portions of a single continuous display surface that includes flat display surfaces 2034 and 2036 that are connected by a foldable display surface 2035 that is located proximate to the spine portion 2030. In some implementation, corresponding to a fold-out bendable display, OLED display surfaces on opposite sides of a single page (e.g., surfaces 2012 and 2014 of page 2206) can be included as different portions of a single continuous display surface that includes flat display surfaces that are connected by a foldable display surface that is located distal to the spine portion and that wraps around an outer edge of the page.

Outermost pages 2002, 2010 of the computing device 2000 can include inward-facing OLED display surfaces 2042, 2044, respectively, that face toward other pages 2004, 2006, 2008 of the computing device. Outermost pages 2002, 2010 of the computing device 2000 also can include outward-facing OLED display surfaces on opposite sides of the pages 2002, 2010 from the inward-facing OLED display surfaces 2042, 2044. The outward-facing OLED display surfaces on the outermost pages 2002, 2010 of the computing device 2000 can be part of a single continuous OLED display surface that also includes an OLED display surface on an outside perimeter of the spine portion 2030 of the computing device 2000. The OLED display device on the outside perimeter of the spine portion 2030 can include a foldable display surface, while the outward-facing OLED display surfaces on the outermost pages 2002, 2010 can be flat, non-bendable surfaces.

In the configuration of the device 2000 that uses fold-in display devices, the foldable display surfaces (e.g., 2035) that connect to facing display surfaces (e.g., 2034, 2036) of adjacent pages (e.g., 2004, 2006) can include a bend limit layer that prevents the radius of curvature of the foldable display surface (e.g., 2035) from going below a minimum radius when the display device is in its folded configuration. In some implementations, the minimum radius can be approximately 0.2 mm. In some implementations, the minimum radius can be approximately 0.5 mm. In some implementations, the minimum radius can be approximately 1.0 mm. In some implementations, the minimum radius can be approximately 3 mm.

In device 2000 that uses fold-in display devices, each different display that includes straight sections on facing pages (e.g., 2034, 2036) connected by a foldable display surface (e.g., 2035) can include its own bend limit layer to prevent the foldable display surface from being folded into a radius below a threshold radius. Straight portions of different adjacent foldable displays that share a common page of the device (e.g., straight portions 2012 and 2014 of page 2006) can be mechanically coupled together without the foldable portions of the different adjacent foldable displays being mechanically coupled, so that individual foldable displays are free to fold and unfold without imparting any strain on the foldable section of an adjacent display.

The minimum radius of curvature of the foldable display surfaces 2035 and the thickness of the pages 2002, 2004, 2006, 2008, 2010 can determine the overall thickness of the device 2000 when the computing device is in its folded configuration, as shown in FIG. 21. For example, when the minimum radius of curvature of the foldable display surfaces 2035 is 1.5 mm and the thickness of the pages 2002, 2004, 2006, 2008, 2010 is 1 mm, then the overall thickness of the computing device in its folded configuration can be as little as 17 mm.

In some implementations, one or more pages 2002, 2004, 2006, 2008, 2010 may not have foldable display surfaces between adjacent pages, but rather each page may be hingedly-attached to the spine portion 2030 of the computing device 2000. By attaching the pages to the spine portion through hinges without having foldable display surfaces between adjacent pages, it may be possible for the pages to be closer together when the computing device 2000 is in its folded configuration than when adjacent pages must be separated from each other by a minimum distance determined by a minimum bend radius that can be tolerated by a foldable display portion 2035 between adjacent pages. In some implementations, the device can include a single continuous foldable display that spans two adjacent pages of the device and that includes a foldable display surface, while the connections between other adjacent pages at the spine portion do not include a foldable display section. In this implementation, the single continuous display that spans two adjacent pages can be used to provide a large format display surface, while displays on other pages can provide a plurality of smaller format display surfaces.

In some implementations, the pages 2002, 2004, 2006, 2008, 2010 may be fixedly attached to the spine portion 2030 (i.e., without use of a hinge mechanism), but portions of the pages proximate to the spine portion 2030 can be bendable about radii larger than a minimum radius, so that the OLED display surface pages 2002, 2004, 2006, 2008, 2010 can be flipped like pages of a hard-bound paper-based book. The minimum radius of portions of the pages 2002, 2004, 2006, 2008, 2010 proximate to the spine portion 2030 that allows the pages to be bent so they can be flipped can be greater than, for example, 2 mm, 5 mm, or 10 mm. In such implementations, without a foldable display portion 2035 that connects facing OLED display surfaces of adjacent pages, adjacent surfaces of adjacent pages of the computing device 2000 can be, for example, less than 1 mm, less than 0.5 mm, less than 0.3 mm, or less than 0.05 mm away from each other when the computing device 2000 is in its folded configuration shown in FIG. 21.

Portions of the above example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the above illustrative embodiments, reference to acts and symbolic representations of operations (e.g., in the form of flowcharts) that may be implemented as program modules or functional processes include routines, programs, objects, components, data structures, etc., that perform particular tasks or implement particular abstract data types and may be described and/or implemented using existing hardware at existing structural elements. Such existing hardware may include one or more Central Processing Units (CPUs), digital signal processors (DSPs), application-specific-integrated-circuits, field programmable gate arrays (FPGAs) computers or the like.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A computing device comprising:
   memory configured for storing executable instructions;
   a processor configured for executing the instructions;
   a spine member, wherein the spine member includes the memory and the processor;
   a plurality of display pages, each display page coupled at a first edge of the page to the spine member and having a second edge, opposite the first edge, that is free to rotate about an axis defined by the spine member, wherein at least one page includes two separately controllable OLED displays on opposite sides of the page;
   a plurality of continuous fold-in OLED displays, wherein each of the continuous fold-in OLED displays includes a first display surface that is attached to a page of the plurality of display pages, a second display surface that is attached to another page of the plurality of display pages, and a foldable third display surface that connects the first and second display surfaces, wherein the foldable third display surface of each of the continuous fold-in OLED displays is located proximate to the spine member relative to the first and second display surfaces; and a bend limit layer coupled to the foldable third display surface of a continuous fold-in OLED display of the plurality of continuous fold-in OLED displays and configured to increase non-linearly its stiffness when a radius of a bend of the bend limit layer is less than a threshold radius of curvature of the continuous fold-in OLED display.

2. The computing device of claim 1, wherein the threshold radius of curvature is less than 3 mm.

3. The computing device of claim 1, further comprising:
a plurality of bend limit layers, each bend limit layer coupled to the foldable third display surface of a continuous fold-in OLED display of the plurality of the continuous fold-in OLED display and configured to increase non-linearly its stiffness when a radius of a bend of the bend limit layers is less than the threshold radius of curvature of the foldable display.

4. The computing device of claim 3, wherein the threshold radius of curvature is less than 1 mm.

5. The computing device of claim 3, wherein the threshold radius of curvature is than 0.5 mm.

6. The computing device of claim 1, wherein each individual continuous fold-in OLED display is free to fold and unfold without imparting any strain on a foldable section of an adjacent continuous fold-in OLED display.

7. The computing device of claim 1, further comprising at least one continuous fold-out OLED display, wherein the continuous fold-out OLED display includes a first display surface that is attached to a first page of the plurality of display pages, a second display surface that is attached to a second page of the plurality of display pages, and a foldable display surface on an outside perimeter of the spine member, wherein the foldable display surface connects the first and second display surfaces, wherein the first and second pages are the pages that are most distant from each other when the computing device is configured such that the first and second pages of the fold-out OLED display are arranged with the other pages between them.

8. The computing device of claim 1, wherein each display page is coupled at its first edge to the spine member by a hinge mechanism, wherein the hinge mechanism is configured to permit a display page to rotate about the hinge mechanism with respect to another display page of the plurality of display pages by up to a maximum angle of 170 to 179 degrees when no torques are applied to the hinge mechanism, other than torques due to gravitational forces on elements of the computing device and forces that hold the device in a stationary position when resting on a flat surface in an unfolded configuration.

9. The computing device of claim 8, wherein the hinge mechanism is configured to permit the display page to rotate about the hinge mechanism with respect to the another display page by an angle of 180 degrees when a torque about the hinge mechanism, which can be applied by a human finger acting on the first and/or or second base portions, is applied to the computing device when the computing device is resting on a flat surface in an unfolded configuration.

10. The computing device of claim 1, wherein portions of the foldable third display surfaces of the plurality of continuous fold-in OLED displays, which portions are most distant from the second edges of the pages to which the display surfaces of the OLED displays are attached, are arranged in a plane when the computing device is in a folded configuration.

11. The computing device of claim 3, wherein the threshold radius of curvature is less than 3 mm.

* * * * *